United States Patent
Yang et al.

(10) Patent No.: US 10,381,499 B1
(45) Date of Patent: Aug. 13, 2019

(54) FLEXIBLE SOLAR ARRAY AND METHOD FOR FABRICATING THE SAME

(71) Applicant: SolAero Technologies Corp., Albuquerque, NM (US)

(72) Inventors: Lei Yang, Albuquerque, NM (US); Daniel McGlynn, Albuquerque, NM (US)

(73) Assignee: SolAero Technologies Corp., Albuquerque, NM (US)

(*) Notice: Subject to any disclaimer, the term of this patent is extended or adjusted under 35 U.S.C. 154(b) by 273 days.

(21) Appl. No.: 15/372,086

(22) Filed: Dec. 7, 2016

(51) Int. Cl.
    *H02N 6/00* (2006.01)
    *H01L 31/05* (2014.01)
    *H01L 31/0465* (2014.01)
    *H01L 31/02* (2006.01)

(52) U.S. Cl.
    CPC .... *H01L 31/0516* (2013.01); *H01L 31/02008* (2013.01); *H01L 31/0465* (2014.12)

(58) Field of Classification Search
    CPC .......................... H01L 31/1892; H01L 31/188; H01L 31/0465
    See application file for complete search history.

(56) References Cited

U.S. PATENT DOCUMENTS

2006/0207646 A1* 9/2006 Terreau ............. B32B 17/10018
                                                    136/251
2010/0282288 A1* 11/2010 Cornfeld ........... H01L 31/02008
                                                    136/244

FOREIGN PATENT DOCUMENTS

JP          H61-105876 A * 5/1986 ......... H01L 31/1892

* cited by examiner

Primary Examiner — Angelo Trivisonno

(57) ABSTRACT

A flexible solar cell assembly and methods for its manufacture are described. The flexible solar cell assembly comprises: solar cells comprising opposing top and back surfaces of different polarities, a contact at the top surface and a contact at the back surface; a flexible substrate; and conductive traces having end portions bonded to the top and bottom contacts of different solar cells so as to interconnect them in electrical series.

17 Claims, 8 Drawing Sheets

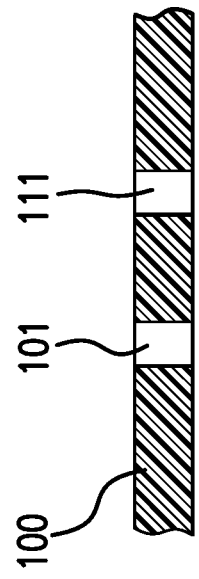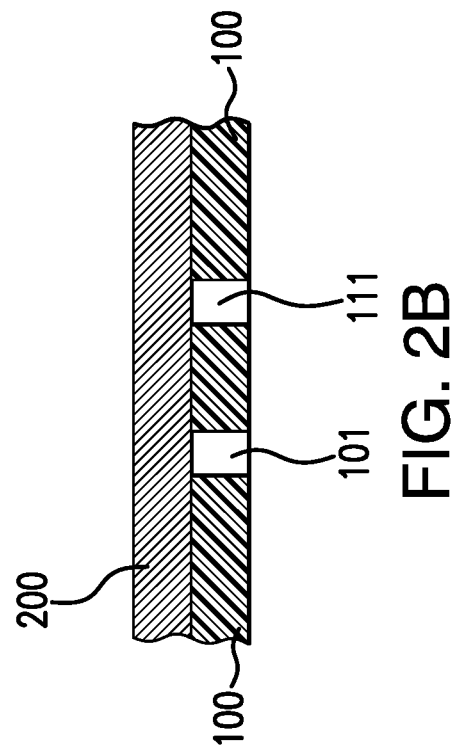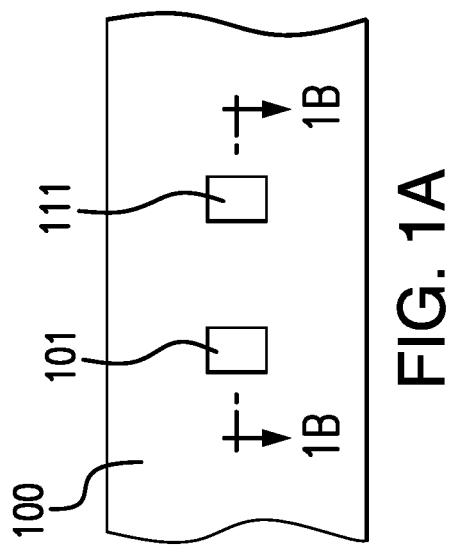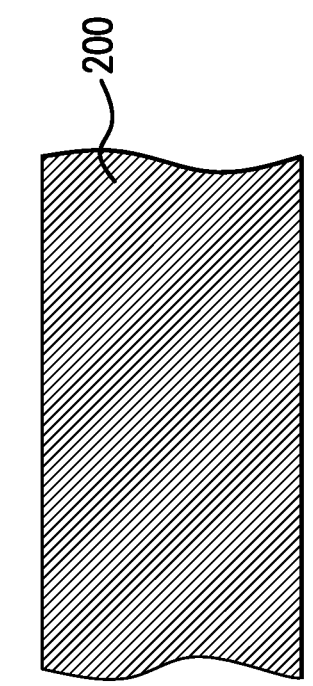

FLEXIBLE SOLAR ARRAY AND METHOD FOR FABRICATING THE SAME

REFERENCE TO RELATED APPLICATIONS

This application is related to U.S. patent application Ser. No. 13/440,331 filed Apr. 5, 2012; Ser. No. 14/306,008 filed Jun. 16, 2014; Ser. No. 14/334,878 filed Jul. 18, 2014; Ser. No. 12/436,467 filed May 6, 2009; and Ser. No. 14/719,111 filed May 21, 2015.

BACKGROUND OF THE INVENTION

1. Field of the Invention

The present invention relates to the field of flexible solar arrays and in particular flexible solar arrays for space/aerospace applications and methods for their fabrication.

2. Description of the Related Art

Conventional solar arrays for space and aerospace applications typically consist of solar cells connected in electrical series by discreet metal interconnects, and bonded to a rigid insulated backing substrate. Typically, multijunction solar cells are mounted on rigid substrates which are in turn assembled into an array and mounted on a panel. Such configurations have been successfully deployed in space applications. However, such use of a rigid substrate places limits on how compactly and efficiently the array can be packed into a launch vehicle or used in an aircraft or other aerospace vehicle.

It has been proposed to mount solar cells on a flexible substrate, allowing rolling and unrolling for more efficient packing in the aerospace vehicle and possible deployment on non-planar surfaces. However, it has proved difficult to provide a flexible solar array that combines ease of manufacturability with sufficient mechanical integrity to withstand multiple roll and unroll deployment cycles.

SUMMARY OF THE INVENTION

One aspect of the disclosure relates to a method of producing a solar cell assembly, comprising:
providing a flexible substrate;
providing a plurality of conductive traces on the substrate, the plurality of conductive traces including a first conductive trace and a second conductive trace, each of the conductive traces being at least partly adhered to the substrate, each of the conductive traces comprising a first end portion and a second end portion;
providing a plurality of solar cells including a first solar cell and a second solar cell, each solar cell comprising a top surface with a top contact of a first polarity and a back surface with a back contact of a second polarity;
bonding the back contact of the first solar cell to the first end portion of the first conductive trace, bonding the back contact of the second solar cell to the first end portion of the second conductive trace, and bonding the second end portion of the first conductive trace to the top contact of the second solar cell for connecting the first solar cell and the second solar cell in electrical series.

In some embodiments, the solar cells can be connected not only in series, but also some series connected cells may be connected in parallel, or two or more cells may be connected in parallel.

It is known in the art to connect solar cells in series by connecting the top contact of one solar cell to the back contact of the preceding or following solar cell in a series of solar cells. This connection can for example be carried out by bonding a conductive element to the top contact of a first solar cell and to the back contact of the other solar cell, or to a conductive trace to which the back contact is connected. US-2010/0282288-A1 shows one example of this kind of arrangement. However, this involves the use of additional conductive elements, such as for example conductive wires, and often the use of additional bonds between components. By using the trace bonded to the back contact of one solar cell and bonding this trace to the top contact of an adjacent solar cell in the series of solar cells there is no need for additional components to establish the connection in series of the solar cells, and the number of bonding points can be minimized. This can be advantageous from the point of view of for example ease of manufacture, cost and/or reliability. Traces can be established on the flexible substrate, for example, by elimination of part of a conductive layer adhered to the substrate or evaporation of a metal pattern, and these traces can used for the interconnection in series of solar cells, without the use of additional components such as wires.

In the present context, the term "trace" refers to a conductive layer on the substrate, preferably a thin conductive layer, for example, a conductive layer having a thickness in the range of from 1 μm and up to 50 μm. The traces can be of a conductive material, such as of metal, for example, copper, gold, silver, nickel, or other materials and conductive alloys thereof.

In some embodiments, the substrate is or comprises a Kapton® layer, that is, a polyimide film layer. In some embodiments the substrate has a thickness in the range of 1 mil (25.4 μm) to 4 mil (101.6 μm).

Although reference has been made to a first solar cell and a second solar cell in series, generally, more solar cells are connected in series, for example, N solar cells can be connected in series by bonding the second end portion of the corresponding (N–1) conductive traces to the top contact of the subsequent or preceding solar cell.

Bonding between the solar cell contacts and the first and second end portions of the traces can take place by any suitable means, including welding such as laser welding, by adhesive, for example, using a conductive adhesive, etc.

In some embodiments, the step of providing a plurality of conductive traces on the substrate comprises:
providing a conductive layer on the substrate; and
removing part of the conductive layer so as to produce the plurality of conductive traces, each one of the plurality of conductive traces being electrically separate from the other conductive traces of the plurality of conductive traces.

A flexible and insulating substrate thus supports a plurality of separate conductive traces. In some embodiments, the conductive layer is a metal layer such as a copper layer, having a thickness in the range of from 1 μm and up to 50 μm. In some embodiments, the step of providing the conductive layer on the substrate comprises attaching the conductive layer to the substrate in an adhesive-less manner, to limit outgassing when the assembly is used in a space environment. Any method suitable for selectively removing part of the conductive layer can be used to establish the traces as defined above.

In some embodiments, the method further comprising the step of providing through holes in the substrate in correspondence with the second end portion of a plurality of said conductive traces. Due to the presence of these through holes, the substrate will not be an obstacle for bonding the respective second end portions to the top contact of the subsequent solar cells. The second end portions can for example be displaced upwards from an original position in the same plane as the first end portion, and subsequently placed in contact with and bonded to the top contact of the subsequent solar cell. For example, the second end portion of the first conductive trace can then be bonded to the top contact of the second solar cell, etc. The through holes can be produced after applying the conductive layer to the substrate, before or after removing part of the conductive layer. Each through hole can have a cross sectional area of approximately the same size as the area of the corresponding second end portion, or larger, or smaller.

In some embodiments, the step of bonding the second end portion of the first conductive trace to the top contact of the second solar cell comprises displacing the second end portion of the first conductive trace upwards from an original position, for example, using an automated assembly fixture. Here the term "upwards" refers to a direction from the substrate and upwards, that is, in a direction from the back contact to the top contact. The displacement of the second end portion of the first conductive trace upwards allows the second end portion to be placed on top of the top contact of the second solar cell, for bonding it to the top contact.

In some embodiments, the step of displacing the second end portion of the first conductive trace upwards comprises bending a third portion of the first conductive trace, wherein the third portion of the first conductive trace electrically interconnects the first end portion and the second end portion of the first conductive trace.

In some embodiments, the step of displacing the second end portion of the first conductive trace upwards is carried out prior to bonding the back contact of the second solar cell to the first end portion of the second conductive trace. In this way, by displacing the second end portion of the first conductive trace upwards before placing and bonding the second solar cell to the second conductive trace, the displacement can take place without any interference between the first end portion of the first conductive trace and the second solar cell.

In some embodiments, the step of displacing the second end portion of the first conductive trace upwards comprises locally deforming the substrate. For example, in some embodiments, the third portion of the conductive trace is adhered to the substrate, so that bending thereof results in local deformation of the substrate.

In some embodiments, the method comprises the step of providing an insulating top layer after providing the plurality of conductive traces on the substrate, the insulating top layer covering the plurality of conductive traces. This can serve to, for example, additionally protect the assembly.

In some embodiments, the method comprises the step of removing part of the top layer providing recesses, one recess providing access to the second end portion of the first conductive trace and to the first end portion of the second conductive trace, etc. That is, each one of a plurality of these recesses can provide access to the second end portion of one of the conductive traces, and to the first end portion of a subsequent conductive trace.

In some embodiments, the method comprises the step of placing solar cells in the recesses. Thus, solar cells can be placed in the recesses making contact with the first end portion of the respective conductive trace and having its back contact bonded to it, whereas the second end portion of a preceding conductive trace can be applied to and bonded to the top contact of the respective solar cell. The solar cells can, for example, be placed using automated equipment, such as pick-and-place equipment.

The back and/or top contacts of the solar cells can in some embodiments be bonded to the respective portions of the conductive traces using a bonding agent such as conductive bonding material, for example, a metal alloy, such as an indium alloy, such as an indium lead alloy. Indium lead has appropriate heat conduction characteristics and at the same time, indium is advantageous as it provides for ductility, thereby reducing the risk for cracks in the bonds between the solar cells and the conductive traces when the assembly is subjected to bending forces.

Another aspect of the disclosure relates to a solar cell assembly, comprising:

a plurality of solar cells including a first solar cell and a second solar cell, each solar cell comprising a top surface with a top contact of a first polarity and a back surface with a back contact of a second polarity;

a flexible substrate;

a plurality of conductive traces including a first conductive trace and a second conductive trace, each of the conductive traces being at least partly adhered to the flexible substrate;

wherein the first solar cell is arranged on the substrate with its back contact bonded to a first end portion of the first conductive trace, and wherein the second solar cell is arranged on the substrate with its back contact bonded to a first end portion of the second conductive trace;

wherein the first conductive trace comprises a second end portion bonded to the top contact of the second solar cell for connecting the first solar cell and the second solar cell in electrical series.

What has been indicated in relation to the method applies to the solar cell assembly, mutatis mutandis.

In some embodiments, the solar cells are arranged with their back contacts in a first plane and with their top contacts in a second plane, and the first end portion and the second end portion of the conductive trace is interconnected by a third portion of the conductive trace that is bent so as to pass through the first plane and the second plane. The reference to first and second planes refers to the assembly when arranged in a flat state, that is, not bent. The third portion of the conductive trace, that is, the portion interconnecting the first and the second end portions of the trace, is in some embodiments bent, for example, in a curved manner, providing a conductive link between the first and second end portions, allowing these portions to remain electrically interconnected in spite of being arranged in different planes, one of them attached to a top contact of a solar cell and one of them to a back contact of an adjacent solar cell.

In some embodiments, the third portion is at least partly adhered to the substrate, so that the substrate is bent in accordance with the third portion. Due to its flexible character, the substrate can be locally bent just as the third portion of the conductive trace, so that the conductive trace can be bent while remaining adhered to the substrate. Thus, the substrate can serve to support the third portion of the conductive trace and ensure its integrity between the first end portion and the second end portion of the conductive trace. For example, displacement upwards of the second end portion of the conductive trace by bending the third portion of the conductive trace can be produced by acting on the corresponding portion of the substrate, pushing it upwards.

In some embodiments, the first end portion of the conductive trace is adhered to the substrate and the second end portion of the conductive trace is not adhered to the substrate. Thus, the second end portion is free from the substrate, that is, there is no substrate under the second end portion, which allows a bottom surface thereof to be bonded to the top contact of the second solar cell.

In some embodiments, the substrate comprises a through hole in correspondence with the second end portion. The function of the through hole has been explained above.

In some embodiments, the solar cell assembly further comprises a flexible top layer on top of the substrate, the solar cells being arranged in recesses in said flexible top layer. This top layer con serve to provide additional protection to the components of the assembly.

In some embodiments, the third portion comprises a at least one curved section, such as a C-shaped or U-shaped section or segment. The term "curved section" refers to the shape of the section in the plane of the trace prior to any displacement upwards of the second end portion, that is, prior to any bending of the third portion. For example, the third portion can comprise or consist of a bent arm, such as a U-shaped arm, or it can have a serpentine or meandering shape. This can serve to provide more flexibility so as to allow the second end portion to be sufficiently displaced from its original position without breaking, tearing, cracking, etc.

In some embodiments, the conductive traces are metal traces having a thickness in the range of from 1 μm and up to 50 μm.

In some embodiments, the substrate comprises a polyimide film layer, such as a Kapton® layer. In some embodiments the substrate consists of a polyimide film layer.

In some embodiments, the solar cells are III-V compound semiconductor solar cells. This kind of high efficiency solar cells are often preferred for space applications, and the present disclosure can be especially preferred for space applications, due to its reliability and due to the fact that it facilitates stowage and deployment of the solar cell assemblies due to their flexibility. It is sometimes preferred to use small solar cells, such as solar cells having a surface area of less than 1 cm$^2$. This requires the interconnection of a large number of solar cells, which is facilitated by the automated interconnection technique of the present disclosure.

In some embodiments, displacing the second end portion upwards comprises: applying through the respective through hole in the substrate an upwards-directed force to the back surface of the respective end portion.

In some embodiments, the method further comprises cutting through regions of the flexible substrate and/or the top layer (if present) to facilitate elevating the second end portions and adjacent portions of the flexible substrate.

In some embodiments, the method further comprises welding the back surfaces of the second end portions to the top contacts of the respective solar cells.

Additional aspects, advantages, and novel features of the present invention will become apparent to those skilled in the art from this disclosure, including the following detailed description as well as by practice of the invention. While the invention is described below with reference to illustrative embodiments, it should be understood that the invention is not limited thereto. Those of ordinary skill in the art having access to the teachings herein will recognize additional applications, modifications and embodiments in other fields, which are within the scope of the invention as disclosed and claimed herein and with respect to which the invention could be of utility.

"Top surface" is used herein to refer to a surface that would face towards incoming solar radiation in normal operation of the flexible solar array, but need not refer to a surface that is directly exposed to the solar radiation, such as a top surface of a backing layer. "Back surface" is used to refer to a surface that would face away from incoming solar radiation in normal operation. Upwards is used to indicate a direction relative to these top and bottom surfaces. A surface abutting another surface need not abut across the entirety of both surfaces.

BRIEF DESCRIPTION OF THE DRAWINGS

The invention will be better and more fully appreciated by reference to the following detailed description when considered in conjunction with the accompanying drawings, wherein:

FIGS. 1A and 1B are a top-plan view and a cross-sectional view of a flexible substrate;

FIG. 2A is a top-plan view of a conductive layer;

FIG. 2B is a cross-sectional view of the conductive layer of FIG. 2A joined to the substrate of FIGS. 1A and 1B;

DESCRIPTION OF THE INVENTION

Figure 2C:
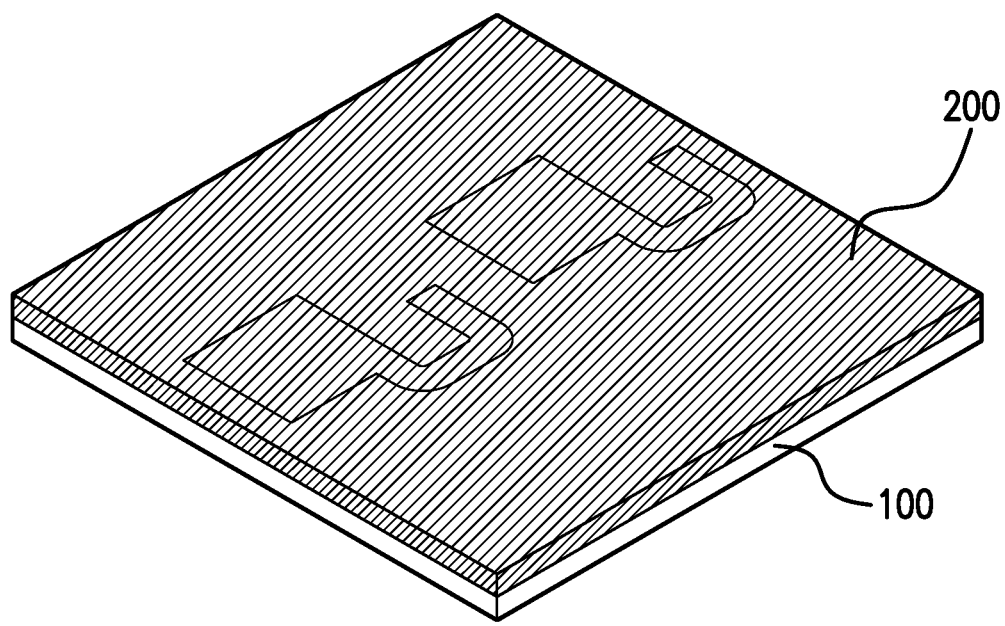
FIG. 2C is an top-inclined view of the substrate and conductive layer of FIG. 2A with conductive layer regions outlined.

Details of the present invention will now be described, including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

FIG. 1A is a schematic depiction of an early stage in the manufacturing of a flexible solar array according to the invention, showing a top-plan view of portions of a flexible substrate 100 and a pair of openings or through holes 101 and 111 that extend from the top surface of the substrate.

FIG. 1B is a cross-sectional view of the substrate 100 along section 1B indicated in FIG. 1A, showing how openings 101 and 111 pass through the entire thickness, i.e., from front to back surface, of substrate 100. Though only two openings are indicated in FIGS. 1A and 1B, the total number of openings in a given substrate, along with the total number of solar cells in a given flexible array, is scalable, depending on the requirements of a particular application.

Substrate 100 may comprise a KAPTON® layer, that is, a polyimide film layer. KAPTON® is a trademark of E.I. du Pont de Nemours and Company. The chemical name for KAPTON® is poly (4,4'-oxydiphenylene-pyromellitimide). Other polyimide film sheets or layers may be used. The thickness of the substrate may in some embodiments be between around 1 and 5 mil (around 25 to 125 µm)

FIG. 2A is a top-plan view of a portion of a conductive layer 200 and FIG. 2B a cross-section view along section 1B indicated in FIG. 1A after conductive layer 200 has been attached by its back surface to the top surface of substrate 100. FIG. 2B shows how the openings 101 and 111 that pass through the entire thickness of substrate 100 expose portions of the bottom surface of conductive layer 200. Conductive layer 200 may comprise any conducting material having suitable electrical and mechanical properties, such as copper having a thickness of around 1 to 50 µm. The conductive layer 200 may be bonded to substrate 100 using any suitable method.

FIG. 2C is a top-inclined view of conductive layer 200 bonded to substrate 100, with two regions of the conductive layer outlined by dashed lines. The openings 101 and 111 in substrate 100 are not shown in FIG. 2C, but fall fully or partly within the regions marked with dashed lines, as discussed below.

Figure 2D:
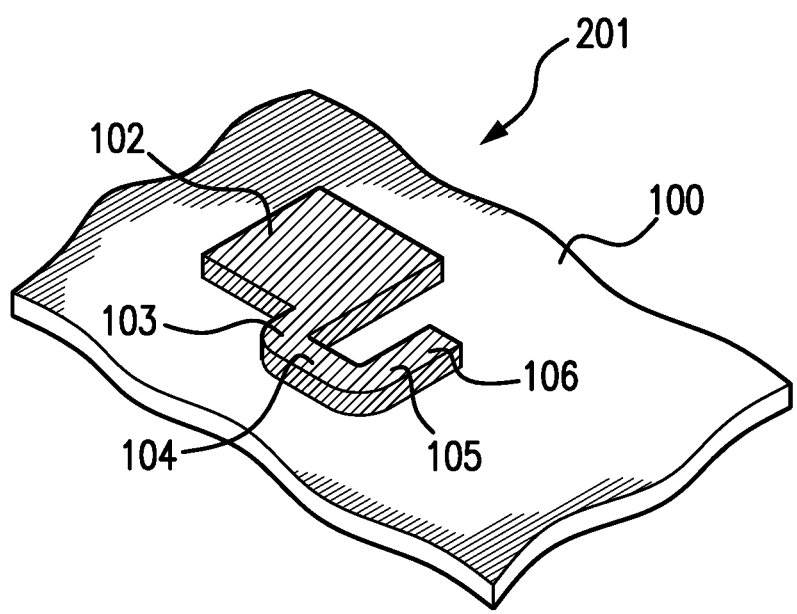
FIG. 2D is an top-inclined view of the conductive layer and substrate of FIG. 2C, after removal of the conductive layer from all but the conducting layer regions, thereby forming conductive traces.

FIG. 2D is an top-inclined view of conductive trace 201 on the top surface of substrate 100, formed by removing portions of the conductive layer 200 outside the regions defined by dashed lines shown in FIG. 2C. Conducting trace 201 comprises a first end portion 102, a second end portion 106 and a third U-shaped portion comprising sections 103, 104 and 105, which connect the first and second end portions. Not shown is opening 101 in substrate 100 located underneath second end portion 106. Opening 101 in substrate 100 may extend beyond the edges of second end portion 106.

Conductive trace 201 may be formed from conductive layer 200 using known processing steps, including formation of the outlined regions shown in FIG. 2C onto a photoresist layer (not shown), and removal of the conducting layer outside these regions by, for example, immersion in a suitable corrosive mixture or plasma-assisted etching, and removal of remaining photo-resist.

Figure 3A:
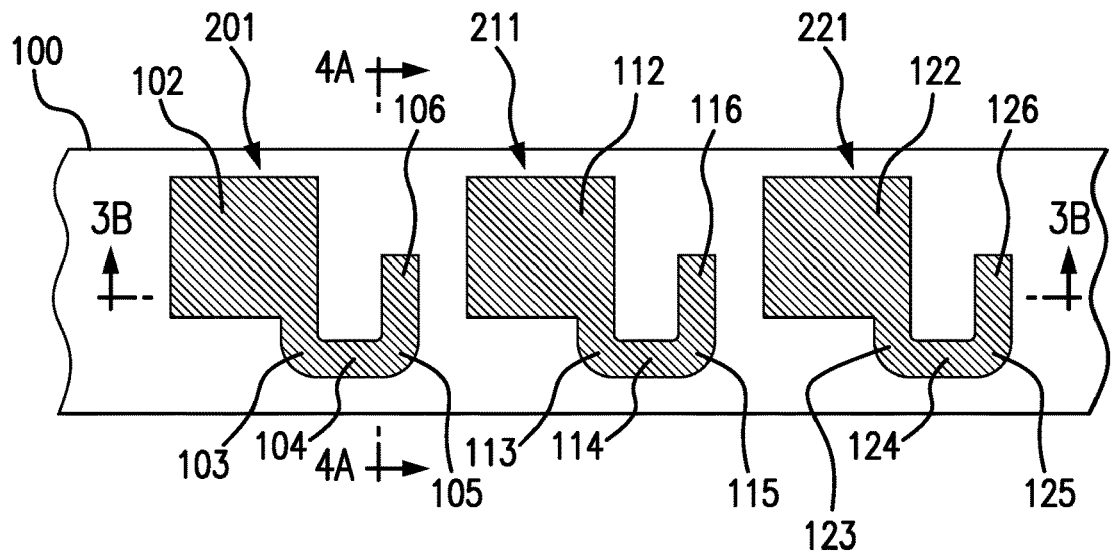
FIGS. 3A and 3B are a top-plan view and a cross-sectional view of the conductive traces and substrate in the top inclined-view of FIG. 2D.

FIG. 3A is a plan top-view showing three conductive traces 201, 211 and 221 on the top surface of substrate 100. Like conductive trace 201, as noted above, conductive traces 211 and 221 also comprises first end portions 112 and 122, second end portions 116 and 126, and third portions 113, 114, 115 and 123, 124, 125 that connect the first and second end portions. Not shown are openings 101, 111 and 121 in substrate 100 located underneath second end portions 106, 116 and 126.

Figure 3B:
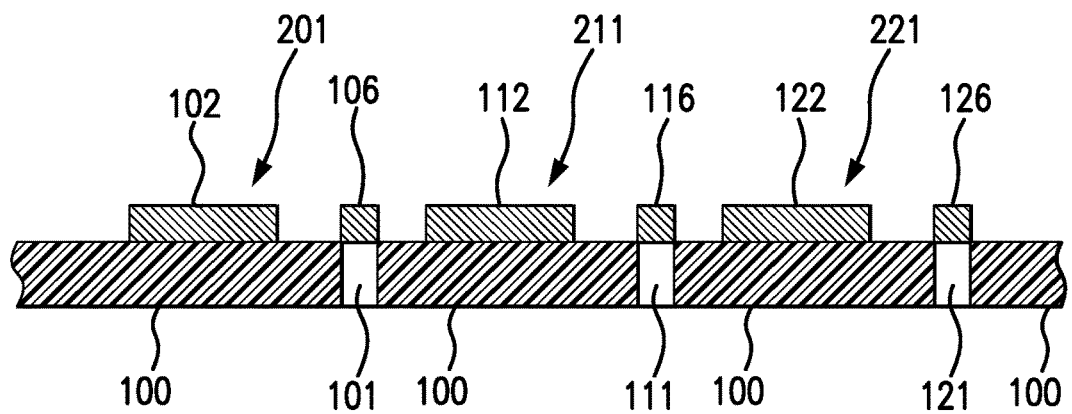

FIG. 3B is a cross-sectional view of substrate 100 and conductive traces 201, 211 and 221 along the section indicated in FIG. 3A. The section shows first end portions 102, 112 and 122, and second end portions 106, 116 and 126, forming part of contact traces 201, 211 and 221, respectively. Openings 101, 111 and 121 are shown having sidewalls perpendicular to the top and back surfaces of substrate 100 and located underneath second end portions 106, 116 and 126. The intersection of openings 101, 111 and 121 with the top surface of substrate 100 are shown having the same widths as the second end portions 106, 116 and 126 formed on the top surface of substrate 100. The sidewalls of openings in the substrate need not be perpendicular to the top and back surfaces of the substrate. Further, the widths of the second end portions and the openings at the substrate top surface need not be identical, as show in FIG. 3B, as long as the relative widths allow the second end portion to be elevated sufficiently to abut a top contact of a retained solar cell, as discussed below.

Figure 3C:
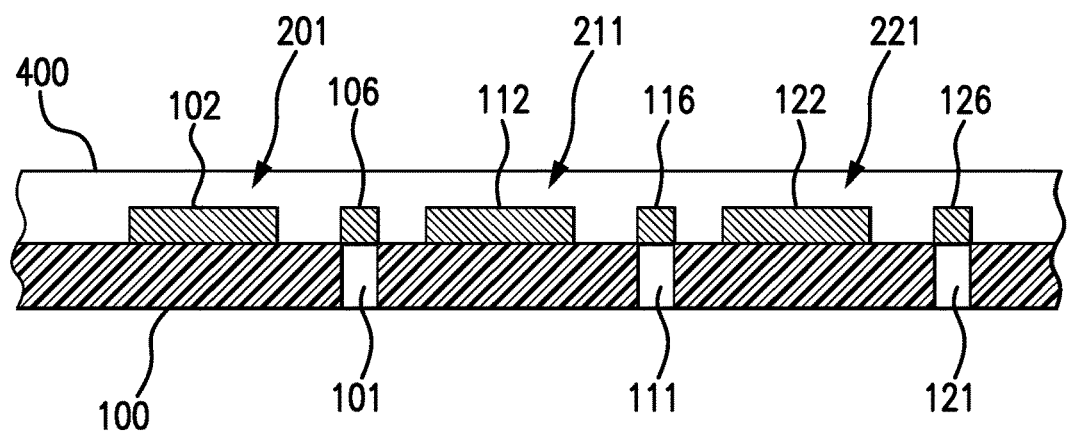
FIG. 3C is a cross-sectional view of the conductive traces and substrate of FIG. 3B after application of a top layer.

FIG. 3C shows the same cross-sectional view of substrate 100 and conductive traces 201, 211 and 212 as FIG. 3B after application of a flexible top layer 400 covering the conducting traces 201, 211 and 212. In FIG. 3C and other figures flexible top layer 400 is shown to present a planar top surface, but the top surface may in fact deviate upwards above the conductive traces. Flexible top layer 400 may be applied, for example, as a solid layer and, as not shown in FIG. 3C, thus comprise slightly elevated top surface regions immediately above conductive traces 201, 211 and 212, respectively.

Flexible top layer 400 may comprise, for example, like flexible backing layer 100, a KAPTON® layer, that is, a polyimide film layer, such as KAPTON® (4,4'-oxydiphenylene-pyromellitimide), or other polyimide film sheets or layers. Top layer 400 may be corona or plasma treated to improve adhesion to the conductive traces and its thickness may be between around 1 and 5 mil (around 25 to 125 µm). The back surface of flexible top layer 400 may be bonded to the top surfaces of the substrate 100 and conductive traces 201, 211 and 212, etc.

Figure 4A:
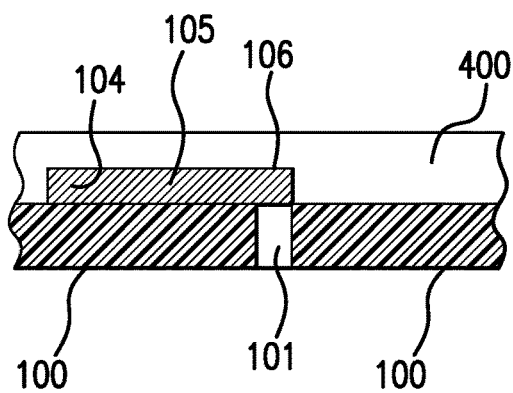
FIGS. 4A and 4B are cross-sectional and top-plan views of a top layer opening exposing portions of the conductive traces and substrate of FIG. 3D.

FIG. 4A is a cross-sectional view along the section shown in FIG. 3B of a portion of conductive trace 201 on the top surface of flexible substrate 100 after application of flexible top layer 400. As in FIGS. 3B and 3C, in FIG. 4A, opening 101 is shown having sidewalls parallel to the top and back surfaces of substrate 100 and forming an opening in the substrate top surface aligned at one side with the end of second end portion 106. The sidewalls of the openings in the substrate need not be perpendicular to its top and back surfaces. Further, the edges of the openings in the top surface of the substrate need not align with the ends of the second end portions, as show in FIG. 4A, as long as their relative alignment allows the second end portion to be elevated to meet a top contact of a retained solar cell, as discussed below.

Figure 4B:
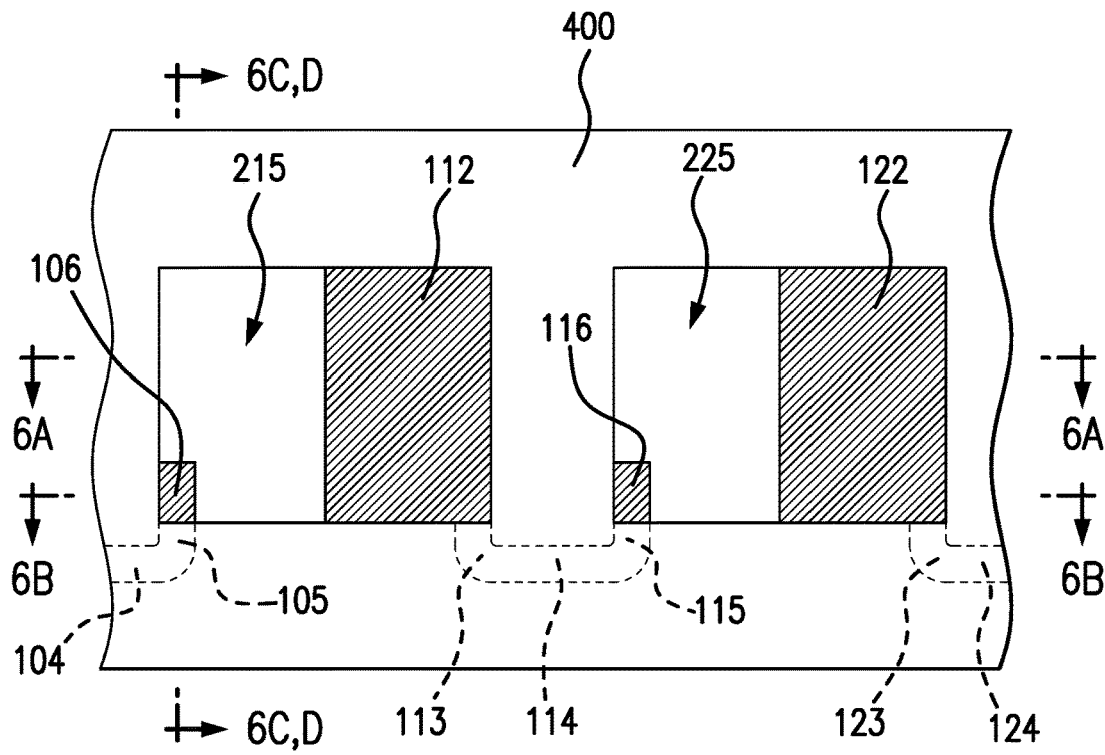

FIG. 4B is a top-plan view of a portion of flexible top layer 400 covering the top surfaces of flexible substrate 100 and conductive traces 201, 211 and 221 after the creation of openings 215 and 225 in the top layer. Each top layer opening exposes a first end portion and a second end portion associated with a different conductive trace. Opening 215 exposes the first end portion 112 of conductive trace 211 and the second end portion 106 of conductive trace 201, while opening 225 exposes the first end portion 122 of conductive trace 221 and the second end portion 116 of conducting trace 211. Further, because a first end portion exposed in a given top layer opening and a second end portion exposed in an adjacent top layer opening are part of the same conductive trace, those first and second end portions are connected by connecting portions buried under the top layer. As shown in FIG. 4B, first end portion 112 exposed by opening 215 is connected by embedded sections 113, 114 and 115 of a third portion of the conductive trace, indicated by dashed lines, to second end portion 116 exposed by opening 225. Also indicated by dashed lines are connecting sections 104 and 105 leading to second end portion 106 in opening 215 and connecting sections 123 and 124 leading from first end portion 122 in opening 225. Not shown in FIG. 4B are the intersections of openings 101 and 111 with the top surface of substrate 100, located underneath second end portions 106 and 116. The intersections of openings 101 and 111 with the top surface of substrate 100 may extend beyond the edges of the openings 215 and 225, in order to facilitate elevation of the regions of the flexible substrate adjacent to second end portions 106 and 116, as discussed below.

Openings 215 and 225 in top layer 400 shown in FIG. 4A may be formed using a variety of techniques. For example, known techniques involving masking and plasma etching that are used to form the conductive traces may also be used to form top surface openings 215 and 225.

The specific layout shown in FIG. 4B, with the top surface openings being rectangular, the first end portions also being rectangular, with three sides being defined by the boundaries of the top surface openings, and the second end portions also being rectangular and disposed at a corner of the top surface openings, need not be adopted. For example, the first end portions need not extend to the edges of the top surface openings and the second end portions may extend from an edge. The top surface openings need not be rectangular, since their shape will depend on that of the solar cells they are to receive. The third portions of the conductive traces, sandwiched between the support and the top layer, indicated by the U-shaped or C-shaped dashed lines in FIG. 4B, also need not be U-shaped. Other possible shapes include, for example, serpentine and meandering shapes.

The sequence of processes in the formation of the top surface layer 400 and formation of openings 205 and 215, as shown in FIGS. 3C to 6, may be varied. For example, the openings in the top layer may be formed before it is applied to the substrate 100 and conductive traces 201, 211 and 221, etc.

Figure 5:
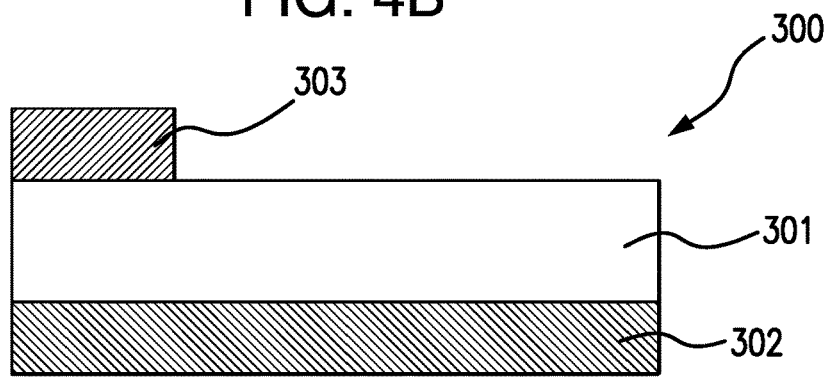
FIG. 5 is a cross-sectional view of a solar cell.

FIG. 5 is a cross-sectional view through a schematic solar cell 300. The solar cell body 301, which may comprise an inverted metamorphic junction (IMM) structure or any other suitable structure, has opposing top and back surfaces, with a top contact 303 shown covering a fraction of the top surface and a back contact 302 shown covering the entire back surface. The skilled person will appreciate that the aspect ratios of the features indicated in FIG. 5 and other figures are not necessarily to scale.

Figure 6A:
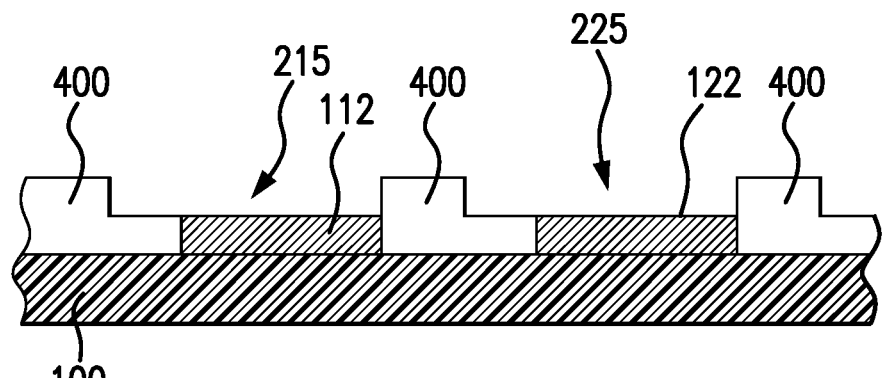
FIGS. 6A to 6D are a cross-sectional views of an arrangement along the sections shown in FIG. 4B.
Figure 6B:
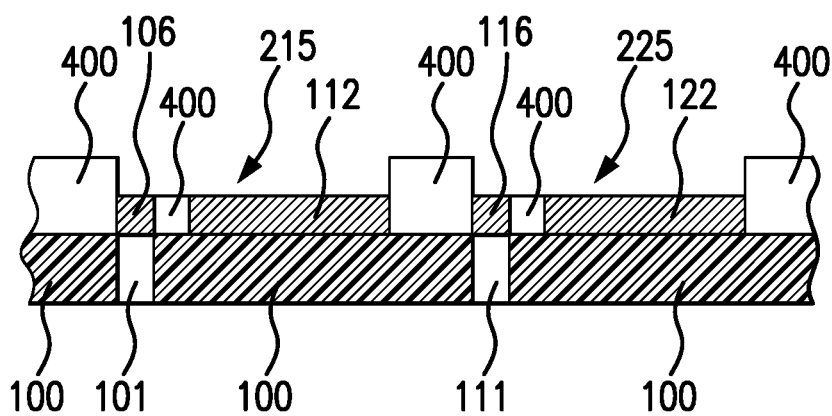

FIGS. 6A and 6B are cross-sectional views along the sections marked in FIG. 4B of flexible top layer 400 covering the top surfaces of flexible substrate 100 and portions of conductive traces 201, 211 and 221 exposed by the creation of openings 215 and 225 in the top layer. As shown in FIGS. 4B and 6A, top layer opening 215 exposes first end portion 112 of conductive trace 211 and top layer opening 225 exposes first end portion 122 of conductive trace 221. The proportions of openings 215 and 225 are adapted to retain the bottom surfaces of solar cells of the type shown in FIG. 5 and to place the solar cell bottom contacts abutting the first end portions, as discussed in relation to FIG. 7 below. As shown in FIGS. 4B and 6B, top layer opening 215 also exposes second end portion 106 of conductive trace 201 located over support opening 101 and top layer opening 225 also exposes second end portion 116 of conductive trace 211 located over support opening 111.

Figure 6C:
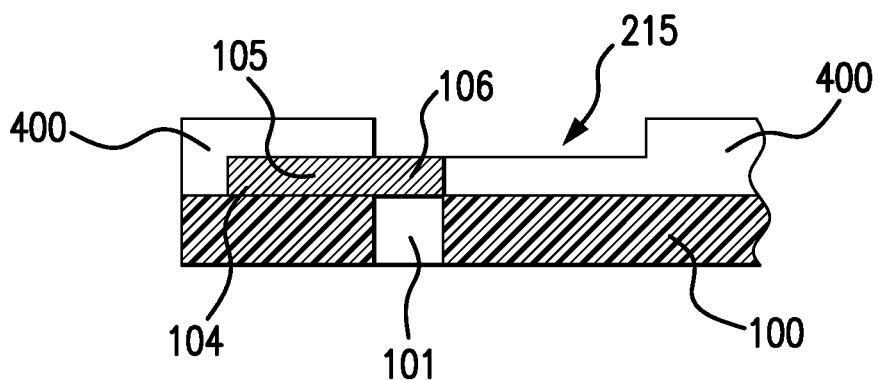
Figure 6D:
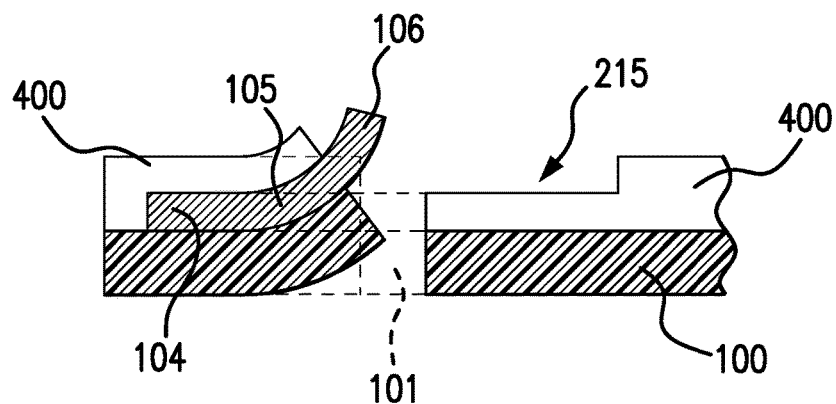

FIGS. 6C and 6D are cross-sectional views along the sections marked in FIG. 4B through flexible top layer 400, opening 215 in flexible top layer 400, support 100 and portions of conductive trace 201. FIG. 6C shows third portion segments 104 and 105 having a back surface abutting the top surface of support 100 and a top surface abutting the back surface of flexible top layer 400. Opening 215 in top layer 400 exposes the top surface of second end portion 106, while opening 101 in support 100 exposes the back surface of second end portion 106. FIG. 6D shows the same section as FIG. 6C after elevation of second end portion 106 and portions of the flexible top layer 400 and substrate 100 containing section 105 of the third portion of the conductive trace 201. Such elevation of second end portion 106 may be realized by, for example, applying one or both of an upward-directed force to the back surface of second end portion 106 through opening 101 and an upward directed force to the region of the back surface of support 100 immediately adjacent to second end portion 106 and containing section 105 of the third portion of the conductive trace. The dashed lines in FIG. 6D represent the outlines of second end portion 106, section 105 of the third portion, and portions of support 100 and top layer 400 before elevation. The skilled person will appreciate that the vertical scale in FIGS. 6C and 6D, as in other figures, is not necessarily representative.

Figure 7:
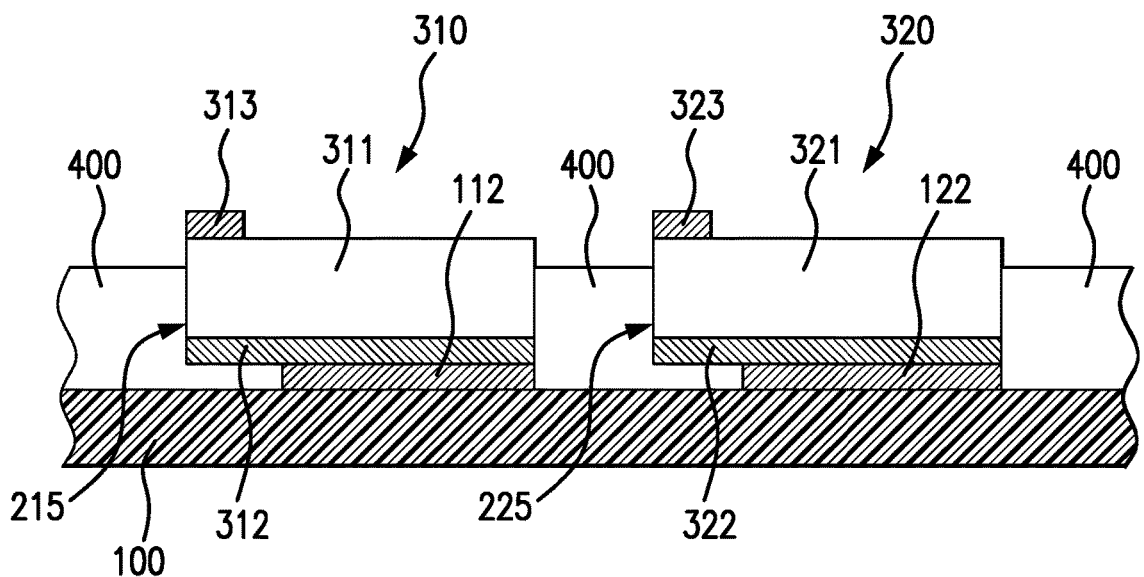
FIG. 7 is a cross-sectional view of an arrangement along the same section as FIG. 6A after introduction into the top surface recesses of solar cells of the type shown in FIG. 5.

FIG. 7 is a cross-sectional view of the arrangement comprising support 100, conductive trace, and top layer along the same section as shown in FIG. 6A after elevation of the second end portions (not shown) and introduction of solar cells of the type shown in FIG. 5 into the top surface recesses created by the top surface openings. Top surface recess 215 retains solar cell 310 with its bottom contact 312 abutting first end portion 112, while top surface recess 225 retains solar cell 320 with its bottom contact 322 abutting first end portion 122. The cross sectional-view of FIG. 7 shows solar cell top contacts 313 and 323 but not abutting second end portions associated with top surface recesses 215 and 225.

Figure 8:
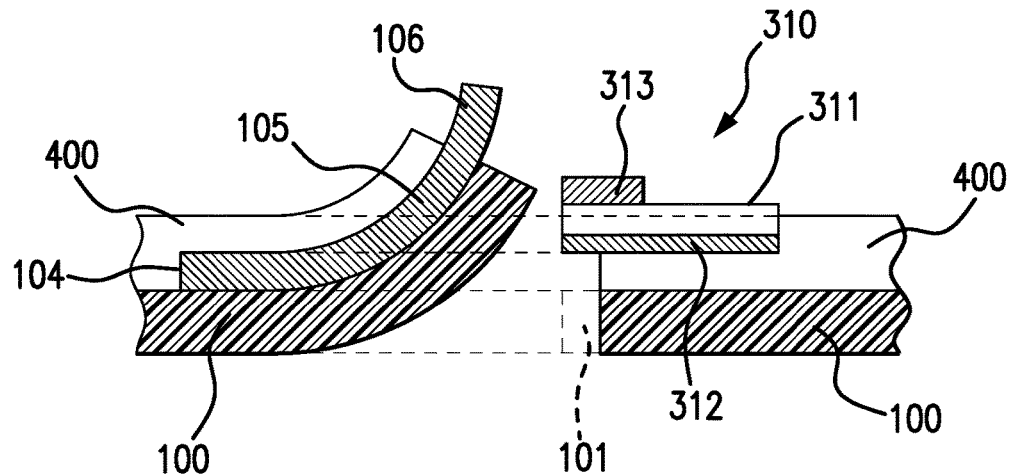
FIG. 8 is a cross section of parts of the arrangement shown in FIG. 4B and solar cell shown in FIG. 5 after elevation of a portion of the flexible substrate and a second end portion of a conductive trace and after introduction of the solar cell into the top surface recess.
Figure 9:
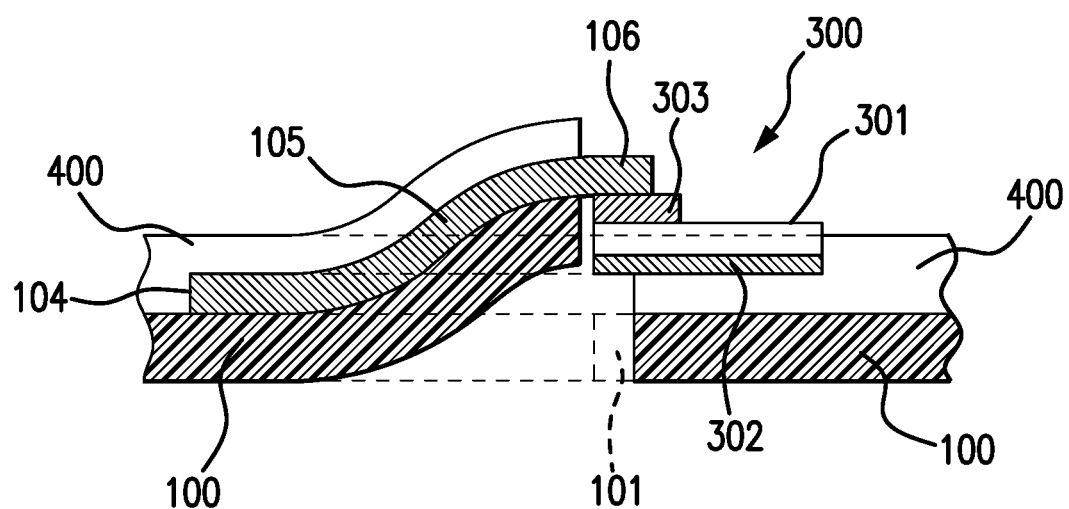
FIG. 9 is a cross section of parts of the arrangement shown in FIG. 8 after depression of the second end portion of the conductive trace to abut the solar cell top contact.

FIG. 8 is a cross-sectional view of the flexible substrate along the same section as in FIG. 6D after elevation of the second end portion 106 and portions of the flexible top layer 400 and substrate 100 containing section 105 of the third portion of the conductive trace 201, and introduction of solar cell 300 of the type shown in FIG. 5 into top surface recess 215. In FIG. 8, as in FIG. 6D, the dashed lines represent the outlines of second end portion 106, section 105 of the third portion, and portions of substrate 100 and top layer 400 before elevation. FIG. 9 is the same cross-sectional view as FIG. 8 after depression of second end portion 106 and portions of the flexible top layers 400 and substrate 100 containing section 105 sufficient to locate second end portion 106 abutting top contact 303 of solar cell 300. Second end portion 106 can be bonded to top contact 303 by welding or other suitable methods.

After introduction of solar cell 300 into top surface recess 215, solar cell back contact 302 may be attached to first end portion 112 (as shown in FIG. 7) and regions of top layer 400 exposed by the opening 215 (as shown in FIGS. 8 and 9), by any suitable process.

The U-shaped or C-shaped connector portion or third portion shown in FIG. 4B comprises a first strip 113 extending in a first direction from the first end portion 112, a second strip 114 extending in a second direction from the first strip and a third strip 115 extending in a third direction from the second strip to the second end portion 116. Such a configuration allows the third portion to accommodate stresses experienced when the second end portion is displaced upwards to abut a solar cell top contact and when the flexible solar array is folded or unfolded as part of its deployment.

Other configurations of the third portion of the conductive trace, comprising differently shaped and oriented sections, are possible.

Figure 10:
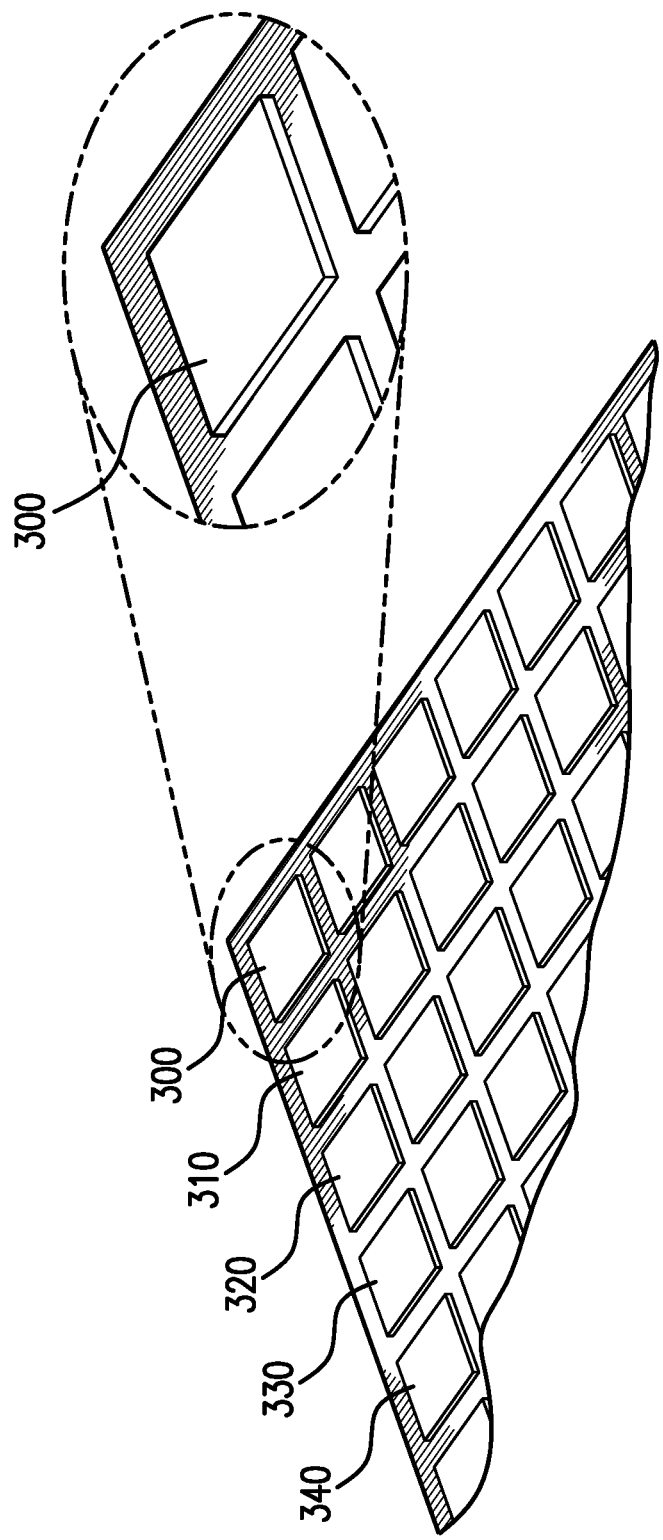
FIG. 10 are top inclined views of an assembly including retained solar cells.

FIG. 10 are top inclined views of a flexible arrangement retaining an array of solar cells 300, 310, 320, 330, 340, etc. FIG. 10 does not show the second end portions abutting solar cell top contacts, the first end portions abutting solar cell bottom contacts and the interconnecting third portions connecting first and second end portions that form an electrical connection between the solar cells retained in the flexible substrate in a series of different configurations. For example, to connect the row comprising solar cells 300, 310, 320, 330 and 340, the first end portion abutting the bottom contact of solar cell 300 connects to the second end portion abutting the top surface of solar cell 310, the first end portion abutting the bottom contact of solar cell 310 connects to the second end portion abutting the top contact of solar cell 320, the first end portion abutting the bottom contact of solar cell 320 connects to the second end portion abutting the top contact of solar cell 330 and the first end portion abutting the bottom contact of solar cell 330 connects to the second end portion abutting the top contact of solar cell 340. A range of connection permutations are possible.

The solar cells may have different sizes or shapes, not just the schematic rectangles shown in FIG. 10, depending on the properties required in a given application. For example, the solar cells may be rectangular, as shown, or may be rectangles with truncated corners, as is typical for solar cells fabricated in batches of two or four from 100 mm diameter wafers.

While the invention has been illustrated and described as embodied to a flexible arrangement retaining solar cells, it is not intended to be limited to the details shown, since various modifications and structural changes may be made without departing in any way from the spirit of the present invention.

All ranges of numerical parameters set forth in this disclosure are to be understood to encompass any and all subranges or "intermediate generalizations" subsumed therein.

The invention claimed is:

1. A method of producing a solar cell assembly, comprising:
   providing a flexible substrate;
   providing a plurality of conductive traces on the flexible substrate, the plurality of conductive traces including a first conductive trace portion and a second conductive trace portion, each of the conductive traces being at least partly adhered to the flexible substrate and each of the conductive traces comprising a first end portion and a second end portion;
   providing a plurality of solar cells including a first solar cell and a second solar cell, each solar cell comprising a top surface with a top contact of a first polarity and a back surface with a back contact of a second polarity; and
   bonding the back contact of the first solar cell to the first end portion of the first conductive trace portion, bonding the back contact of the second solar cell to the first end portion of the second conductive trace portion, and bonding the second end portion of the first conductive trace portion to the top contact of the second solar cell for connecting the first solar cell and the second solar cell in electrical series,
   wherein the conductive traces further comprise a third portion connecting the first end portion and second end portion, wherein the plurality of solar cells are arranged with their back contacts in a first plane and their top contacts in a second plane, and wherein the third portion of the first conductive trace portion is bent so as to pass through the first plane and the second plane,
   wherein the step of bonding the second end portion of the first conductive trace portion to the top contact of the second solar cell comprises displacing the second end portion of the first conductive trace portion upwards from an original position.

2. The method according to claim 1, wherein the step of providing a plurality of conductive traces on the flexible substrate comprises:
   providing a conductive layer on the flexible substrate; and
   removing part of the conductive layer so as to produce the plurality of conductive traces, each one of the plurality of conductive traces being electrically separate from the other conductive traces of the plurality of conductive traces.

3. The method according to claim 1, further comprising the step of providing through holes in the flexible substrate in correspondence with the second end portion of said conductive traces.

4. The method according to claim 1, wherein the step of displacing the second end portion of the first conductive trace portion upwards comprises bending a third portion of the first conductive trace portion, wherein the third portion of the first conductive trace portion electrically interconnects the first end portion and the second end portion of the first conductive trace portion.

5. The method according to claim 1, wherein the step of displacing the second end portion of the first conductive trace portion upwards is carried out prior to bonding the back contact of the second solar cell to the first end portion of the second conductive trace portion.

6. The method according to claim 1, wherein the step of displacing the second end portion of the first conductive trace portion upwards comprises locally deforming the flexible substrate.

7. The method according to claim 1, comprising the step of providing an insulating top layer after providing the plurality of conductive traces on the flexible substrate, the insulating top layer covering the plurality of conductive traces.

8. The method according to claim 7, comprising the step of removing part of the top layer providing recesses, one recess providing access to the second end portion of the first conductive trace portion and to the first end portion of the second conductive trace portion.

9. The method according to claim 8, comprising the step of placing solar cells in the recesses.

10. A solar cell assembly, comprising:
    a plurality of solar cells including a first solar cell and a second solar cell, each solar cell comprising a top surface with a top contact of a first polarity and a back surface with a back contact of a second polarity;
    a flexible substrate;
    a plurality of conductive traces including a first conductive trace portion and a second conductive trace portion, each of the conductive traces being at least partly adhered to the flexible substrate;
    wherein the first solar cell is arranged on the flexible substrate with its back contact bonded to a first end portion of the first conductive trace portion, and wherein the second solar cell is arranged on the flexible substrate with its back contact bonded to a first end portion of the second conductive trace portion;
    wherein the first conductive trace portion comprises a second end portion bonded to the top contact of the second solar cell for connecting the first solar cell and the second solar cell in electrical series; and wherein the conductive traces further comprise a third portion connecting the first end portion and second end portion, wherein the plurality of solar cells are arranged with their back contacts in a first plane and their top contacts in a second plane, and wherein the third portion of the first conductive trace portion is bent so as to pass through the first plane and the second plane, wherein the first end portion of the conductive traces is adhered to the flexible substrate and wherein the second end portion of the conductive traces is not adhered to the flexible substrate.

11. The solar cell assembly according to claim 10, wherein the third portion is at least partly adhered to the flexible substrate, so that the flexible substrate is bent in accordance with the third portion.

12. The solar cell assembly according to claim 10, wherein the flexible substrate comprises a through hole in correspondence with the second end portion.

13. The solar cell assembly according to claim 10, further comprising a flexible top layer on top of the flexible substrate, the solar cells being arranged in recesses in the flexible top layer.

14. The solar cell assembly according to claim 10, wherein the third portion comprises at least one curved section.

15. The solar cell assembly according to claim 10, wherein the conductive trace portions are metal traces having a thickness in the range of from 1 µm and up to 50 µm.

16. The solar cell assembly according to claim 10, wherein the flexible substrate comprises a polyimide film layer.

17. The solar cell assembly according to claim 10, wherein the solar cells are III-V compound semiconductor solar cells.

* * * * *